United States Patent
Roy et al.

(10) Patent No.: US 11,929,141 B2
(45) Date of Patent: Mar. 12, 2024

(54) SPARSITY-AWARE RECONFIGURABLE COMPUTE-IN-MEMORY (CIM) STATIC RANDOM ACCESS MEMORY (SRAM)

(71) Applicant: Purdue Research Foundation, West Lafayette, IN (US)

(72) Inventors: Kaushik Roy, West Lafayette, IN (US); Amogh Agrawal, West Lafayette, IN (US); Mustafa Fayez Ahmed Ali, West Lafayette, IN (US); Indranil Chakraborty, West Lafayette, IN (US); Aayush Ankit, West Lafayette, IN (US); Utkarsh Saxena, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 300 days.

(21) Appl. No.: 17/643,215

(22) Filed: Dec. 8, 2021

(65) Prior Publication Data

US 2023/0178125 A1    Jun. 8, 2023

(51) Int. Cl.
  *H03M 1/12*    (2006.01)
  *G11C 7/10*    (2006.01)
  *G11C 7/16*    (2006.01)

(52) U.S. Cl.
  CPC .............. *G11C 7/16* (2013.01); *G11C 7/1012* (2013.01); *G11C 7/1063* (2013.01); *G11C 7/109* (2013.01); *H03M 1/1245* (2013.01)

(58) Field of Classification Search
  CPC ....... G11C 7/16; G11C 7/1012; G11C 7/1063; G11C 7/109; H03M 1/1245
  See application file for complete search history.

(56) References Cited

U.S. PATENT DOCUMENTS

2022/0021833 A1\* 1/2022 Berkovich ........... H04N 25/443

OTHER PUBLICATIONS

Biswas, A. et al., "Conv-RAM: An energy-efficient SRAM with embedded convolution computation for low-power CNN-based machine learning applications," 2018 IEEE International Solid—State Circuits Conference (ISSCC), Feb. 11-15, 2018, San Francisco, CA, USA, IEEE, pp. 488-490.

Chakraborty, I. et al., "GENIEx: A Generalized Approach to Emulating Non-Ideality in Memristive Xbars using Neural Networks," arXiv:2003.06902v1 [cs.ET], Mar. 15, 2020, 7 pages.

Dong, Q. et al., "15.3 A 351TOPS/W and 372.4GOPS Compute-in-Memory SRAM Macro in 7nm FinFET CMOS for Machine-Learning Applications," 2020 IEEE International Solid—State Circuits Conference (ISSCC), Feb. 16-20, 2020, San Francisco, CA, USA, IEEE, 3 pages.

(Continued)

*Primary Examiner* — Joseph J Lauture
(74) *Attorney, Agent, or Firm* — Withrow & Terranova, P.L.L.C.

(57) ABSTRACT

Sparsity-aware reconfiguration compute-in-memory (CIM) static random access memory (SRAM) systems are disclosed. In one aspect, a reconfigurable precision succession approximation register (SAR) analog-to-digital converter (ADC) that has the ability to form (n+m) bit precision using n-bit and m-bit sub-ADCs is provided. By controlling which sub-ADCs are used based on data sparsity, precision may be maintained as needed while providing a more energy efficient design.

17 Claims, 6 Drawing Sheets

(56) References Cited

OTHER PUBLICATIONS

Si, X. et al., "24.5 A Twin-8T SRAM Computation-In-Memory Macro for Multiple-Bit CNN-Based Machine Learning," 2019 IEEE International Solid—State Circuits Conference (ISSCC), San Francisco, CA, USA, Feb. 17-21, 2019, IEEE, 3 pages.
Si, X. et al., "15.5 A 28nm 64Kb 6T SRAM Computing-in-Memory Macro with 8b MAC Operation for AI Edge Chips," 2020 IEEE International Solid—State Circuits Conference (ISSCC), Feb. 16-20, 2020, San Francisco, CA, USA, IEEE, 3 pages.
Su, J.-W. et al., "15.2 A 28nm 64Kb Inference-Training Two-Way Transpose Multibit 6T SRAM Compute-in-Memory Macro for AI Edge Chips," 2020 IEEE International Solid—State Circuits Conference (ISSCC), Feb. 2020, IEEE, 3 pages.
Valavi, H. et al., "A 64-Tile 2.4-Mb In-Memory-Computing CNN Accelerator Employing Charge-Domain Compute," IEEE Journal of Solid-State Circuits, vol. 54, Issue 6, Mar. 2019, IEEE, 11 pages.
Yue, J. et al., "14.3 A 65nm Computing-in-Memory-Based CNN Processor with 2.9-to-35.8TOPS/W System Energy Efficiency Using Dynamic-Sparsity Performance-Scaling Architecture and Energy-Efficient Inter/Intra-Macro Data Reuse," 2020 IEEE International Solid—State Circuits Conference (ISSCC), Feb. 16-20, 2020, San Francisco, CA, USA, IEEE, 3 pages.

\* cited by examiner

SPARSITY-AWARE RECONFIGURABLE COMPUTE-IN-MEMORY (CIM) STATIC RANDOM ACCESS MEMORY (SRAM)

GOVERNMENT SUPPORT

This invention was made with government support under Grant No. HR0011-18-3-0004 awarded by the Department of Defense/Defense Advanced Research Projects Agency (DARPA). The government has certain rights in the invention.

BACKGROUND

I. Field of the Disclosure

The technology of the disclosure relates generally to digital memory structures, and particularly, to memory structures configured to provide compute-in-memory (CIM) functionality.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to provide fast, energy-efficient memory structures that allow for storage of computer instructions and data while also providing acceptably low latency. The demand for such fast, energy-efficient memory structures is not limited to mobile communication devices but is applicable to most modern computing devices.

Compute-in-memory (CIM) has been proposed to help provide lower latency computational capability, particularly in artificial intelligence and machine learning applications. CIM performs functions directly in the fabric of the memory to reduce latency and frequently relies on analog computation. The analog computation relies on analog-to-digital converters (ADCs) to pass an output to a subsequent macro. The ADCs may be energy intensive, consume relatively large amounts of space in an integrated circuit, and add latency. Accordingly, there remains room for improvement in providing more efficient ADCs for CIM.

SUMMARY

Aspects disclosed in the detailed description include sparsity aware reconfigurable compute-in-memory (CIM) static random access memory (SRAM). In particular, exemplary aspects of the present disclosure provide a reconfigurable precision succession approximation register (SAR) analog-to-digital converter (ADC) that has the ability to form (n+m) bit precision using n-bit and m-bit sub-ADCs. By controlling which sub-ADCs are used based on data sparsity, precision may be maintained as needed while providing a more energy efficient design.

In this regard in one aspect, a memory circuit is disclosed. The memory circuit comprises a memory array comprising a plurality of memory cells. The memory circuit also comprises an ADC. The ADC comprises a first m-bit sub-ADC. The ADC also comprises a first n-bit sub-ADC, wherein n does not equal m. The memory circuit also comprises a control circuit coupled to the memory array. The control circuit is configured to determine a workload sparsity level. The control circuit is configured, based on the workload sparsity level, to determine a bit-precision requirement. The control circuit is also configured, based on the bit-precision requirement, to activate the first m-bit sub-ADC, the first n-bit sub-ADC, or both.

In another aspect, a method is disclosed. The method comprises, in a memory cell, determining a workload sparsity level. The method also comprises, based on the workload sparsity level, determining a bit-precision requirement. The method also comprises, based on the bit-precision requirement, activating a first m-bit sub-ADC, a first n-bit sub-ADC, or both.

DETAILED DESCRIPTION

Figure 1:
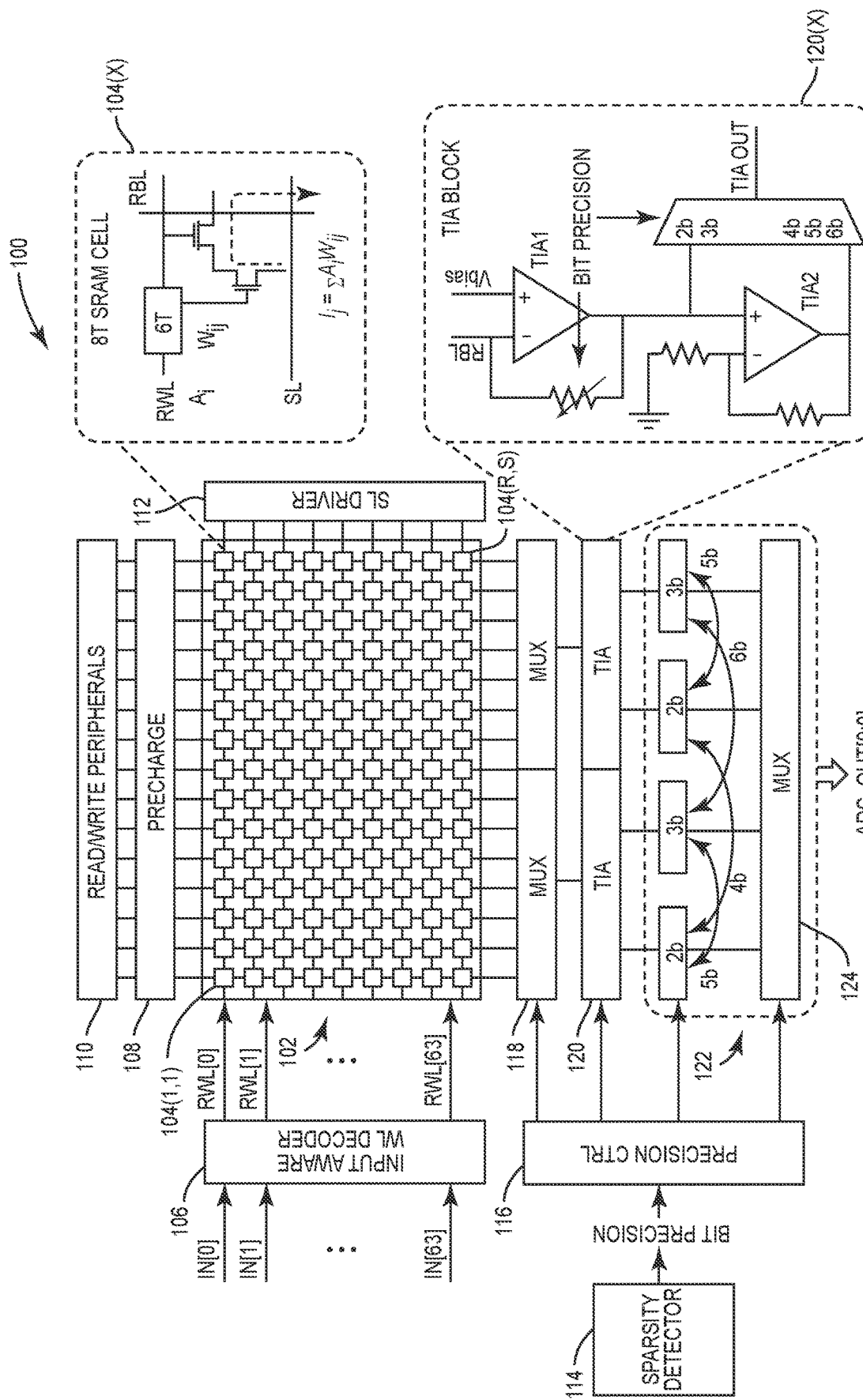
FIG. 1 is a block diagram of an exemplary memory array circuit that includes reconfigurable analog-to-digital converters (ADCs) according to aspects of the present disclosure.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include sparsity-aware reconfigurable compute-in-memory (CIM) static random access memory (SRAM). In particular, exemplary aspects of the present disclosure provide a reconfigurable precision succession approximation register (SAR) analog-to-digital converter (ADC) that has the ability to form (n+m) bit precision using n-bit and m-bit sub-ADCs. By controlling which sub-ADCs are used based on data sparsity, precision may be maintained as needed while providing a more energy efficient design.

In this regard, FIG. 1 is a block diagram of a memory circuit 100 that includes a memory array 102. The memory array 102 includes memory cells 104(1,1)-104(R,S). In an exemplary aspect, the memory cells 104(1,1)-104(R,S) may be formed of eight transistors (8T) and be an SRAM cell, as illustrated by exemplary memory cell 104(X). The memory array 102 is arranged into rows and may be coupled to an input-aware word line (WL) decoder circuit 106. The word line decoder circuit 106 may provide read word line commands (RWL[0:R]) to the memory array 102. The memory array 102 may further be coupled to a precharge circuit 108, which is also coupled to any read/write peripherals 110. The memory array 102 may further be coupled to a source line (SL) driver circuit 112.

With continued reference to FIG. 1, it should be appreciated that the memory circuit 100 may be configured to support CIM and as such may enable one or multiple rows of memory cells 104(1,1)-104(R,S) based on control signals on the read word lines. The voltage or current on the read word lines may indicate a multiplication or accumulation of the input data given to the memory circuit 100 by actual data that is currently stored in the memory cells 104(1,1)-104(R, S). Further, it should be appreciated that the bit line voltage or current is analog, and thus, to be passed to another macro, a conversion to a digital value is required such as by using an ADC. Conventional ADCs are generally expensive, in terms of latency, power, and an amount of space consumed.

Exemplary aspects of the present disclosure provide a new ADC with sub-ADCs that allow for adaptive reconfigurations based on data sparsity in the input signal. Specifically, depending on how many zeros are present in the input signal used for CIM, a required bit resolution may be determined and used to configure the ADC appropriately. It should be appreciated that the input signal is known a priori since it is being used as part of the CIM calculation. Exemplary aspects of the present disclosure provide the input signal to a sparsity detector circuit 114 that examines the input signal and generates a bit-precision signal based thereon. The bit-precision signal is provided to a precision control circuit 116. While illustrated as a separate circuit, it should be appreciated that the sparsity detector circuit 114 may be part of the precision control circuit 116 or may be software within the precision control circuit 116. The precision control circuit 116 sends signals to a first set of multiplexers (MUX) 118, a set of transimpedance amplifiers (TIAs) 120, sub-ADCs 122, and optionally to a second MUX 124. The first set of MUX 118 are coupled to the memory array 102. The second MUX 124 provides an ADC output signal ADC_out[9:0]. Details on a given TIA 120 (including how the bit-precision signal from the precision control circuit 116 is provided) are provided in the expanded circuit 120(X). It should be appreciated that the TIA 120 may be reconfigurable through a resistor network (not shown) to maintain the output voltage range at different precisions.

Figure 2:
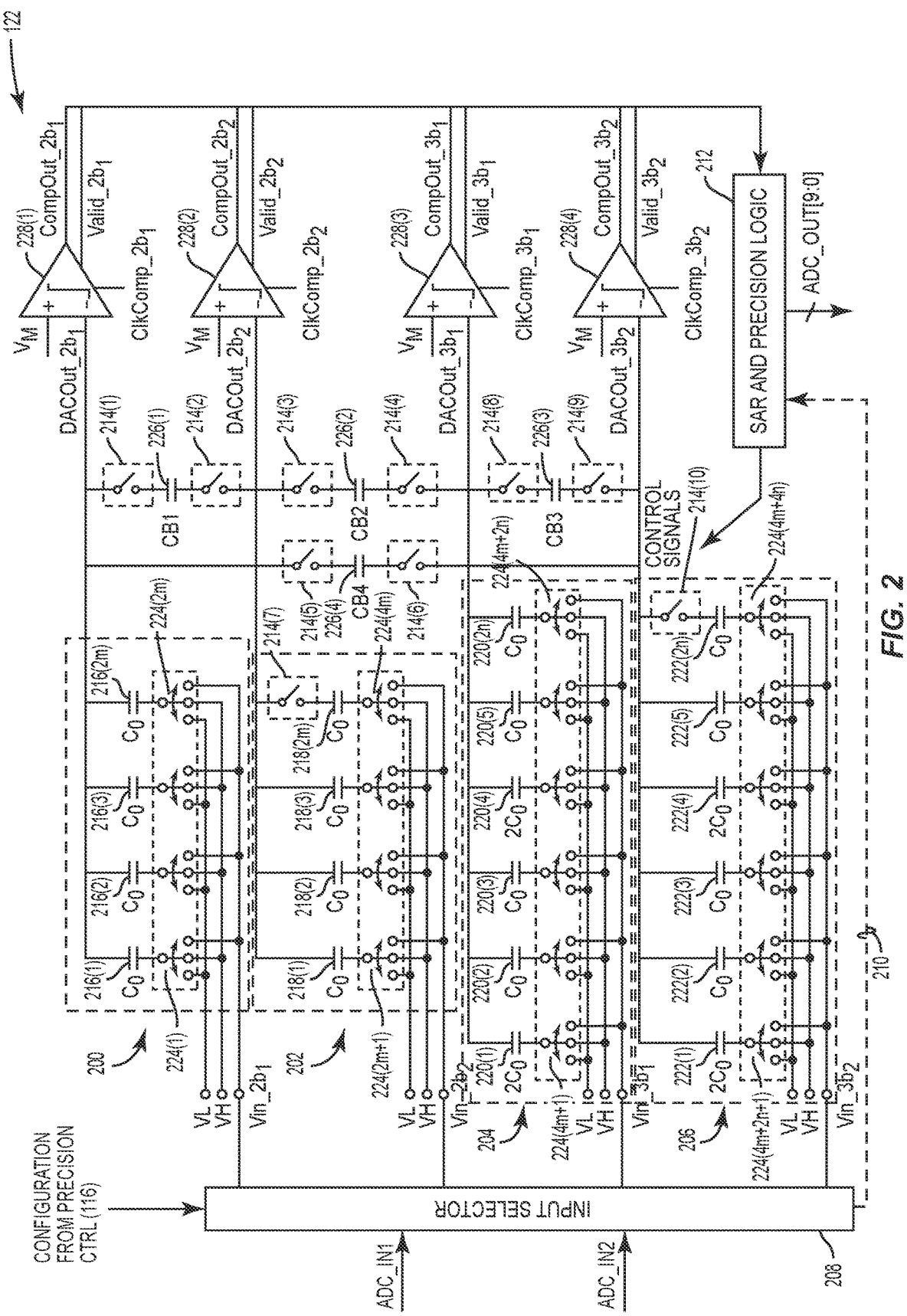
FIG. 2 is a circuit diagram of the reconfigurable ADCs of FIG. 1.

More detail on the ADC 122 is provided with reference to FIG. 2. Specifically, the ADC 122 may include a first m-bit sub-ADC 200, a second m-bit sub-ADC 202, a first n-bit sub-ADC 204, and a second n-bit sub-ADC 206, where in does not equal n, and as illustrated m=2 and n=3. The ADC 122 further includes an input selector circuit 208 that may receive configuration commands from the precision control circuit 116 of FIG. 1. A signal 210 is provided from the input selector circuit 208 to a SAR and precision logic circuit 212. The input selector circuit 208 receives input signals ADC_IN1 and ADC_IN2 from the set of TIAs 120. The input selector circuit 208 provides input signals (e.g., Vin_$2b_1$, Vin_$2b_2$, Vin_$3b_1$, and Vin_$3b_2$ to the sub-ADCs 200, 202, 204, and 206. The SAR and precision logic circuit 212 may include the second MUX 124 and outputs the signal ADC_OUT[9:0].

Activation of the sub-ADCs 200, 202, 204, and 206 is controlled by switches 214(1)-214(10). The sub-ADCs 200 and 202 include 2*m capacitors ($C_O$) 216(1)-216(2*m) and 218(1)-218(2*m), respectively. Likewise, the sub-ADCs 204 and 206 include 2*n capacitors 220(1)-220(2*n) and 222(1)-222(2*n), respectively, where 220(1), 222(1), 220(n+1), and 222(n+1) have capacitances twice as large as the other capacitors (2$C_O$ versus $C_O$) as noted. Each capacitor 216(1)-216(2*m), 218(1)-218(2*m), 220(1)-220(2*n), and 222(1)-222(2*n) is coupled to a respective three-way switch 224(1)-224(4m+4n). Each three-way switch 224(1)-224(4m+4n) is coupled to a voltage low line (VL) and a voltage high (VH) line. The switching between the VL and VH line is in keeping with the nature of a SAR ADC, which uses successive computations toggling as needed between high and low values to arrive at an end value.

Additional capacitors 226(1)-226(4) are provided between switches 214(1)/214(2); 214(3)/214(4); 214(8)/214(9); and 214(5)/214(6), respectively. By controlling the switches 214(1)-214(10), the SAR and precision logic circuit 212 controls which of the sub-ADCs 200, 202, 204, and 206 provide outputs to differential amplifiers 228(1)-228(4). The outputs of the differential amplifiers 228(1)-228(4) are provided to the SAR and precision logic circuit 212, which uses these outputs to generate the output signal ADC_OUT [9:0].

While FIG. 2 contemplates first and second sub-ADCs for each of m and n with specific values contemplated for m and n, the present disclosure is not so limited. It should be appreciated that other values of m and n may be chosen; there may be more than two of a particular m-bit sub-ADC or n-bit sub-ADC (e.g., there may be three m-bit sub-ADCs and four n-bit sub-ADCs); and there may be a p-bit sub-ADC (not shown). In particular, the number of m-bit or n-bit sub-ADCs may be varied to provide different bit-precision options. Likewise, the addition of a p-bit sub-ADC may provide additional flexibility for bit-precision calculations.

Figure 3:
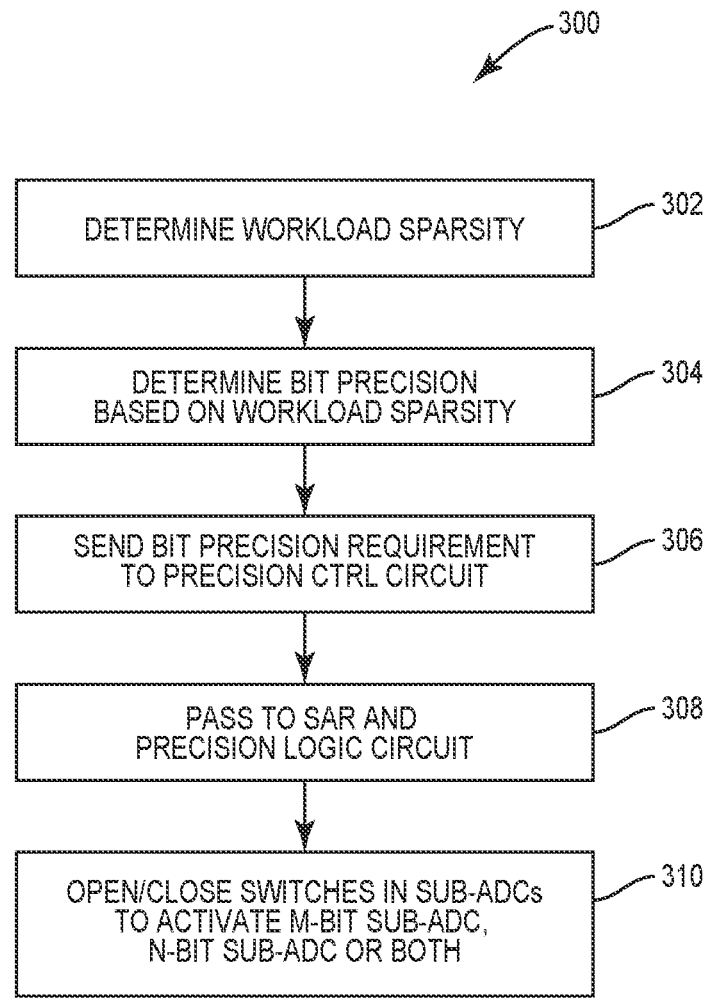
FIG. 3 is a flowchart illustrating an exemplary process for using the reconfigurable ADCs according to data sparsity.

With the structure of the ADC 122 set forth in FIG. 2, it is possible to explore a process 300 of using the ADC 122 with better reference to FIG. 3. The process 300 begins when a control circuit, in this case, the sparsity detector circuit 114, determines a workload sparsity level (block 302). This determination may be done, for example, by counting zeros in the input signal. Alternatively, ones may be counted with the understanding that the information provided by one method is the complement of the information provided by the second method. A control circuit, in this case the sparsity detector circuit 114, then determines a bit-precision requirement based on the workload sparsity level (block 304). In an exemplary aspect, the bit-precision requirement is 2, 3, 4, 5, or 6 bits. The sparsity detector circuit 114 then sends the bit-precision requirement to the precision control circuit 116 (block 306). If the sparsity detector circuit 114 is part of the precision control circuit 116, "sending" in this context may be to another portion of the circuit. The precision control circuit 116 then passes information relating to the bit-precision requirement to the SAR and precision logic circuit 212 (block 308). In an exemplary aspect, the information relating to the bit-precision requirement may be a switch configuration, a command to assume a particular switch configuration, the bit-precision requirement unaltered, or the like. The precise form of the information is not central to the present disclosure so long as the SAR and precision logic circuit 212 has enough information to send control signals that open and close switches in the sub-ADCs 200, 202, 204, and 206 to activate a given m-bit sub-ADC 200, 202, a given n-bit sub-ADC 204, 206 or both an m-bit sub-ADC and an n-bit sub-ADC (block 310).

The presence of the multiple m-bit sub-ADCs and n-bit sub-ADCs allows for a summation to be made to meet a desired bit precision requirement. For example, a 2-bit precision requirement may be met with a single m-bit sub-ADC 200 or 202 (or both). A 3-bit precision requirement may be met with a single n-bit sub-ADC 204,206 (or both). A 4-bit precision requirement may be met by using both m-bit sub-ADCs 200, 202 and summing the output. A 5-bit precision requirement may be met by using a first m-bit sub-ADC 200 and a first n-bit sub-ADC 204 and summing the output. A 6-bit precision requirement may be met by using both n-bit sub-ADCs 204,206 and summing the output. Higher bit requirements may be met using a sum of appropriate sub-ADCs (including possibly a p-bit sub-ADC (still not shown), third n-bit sub-ADC, or the like).

Figure 4A:
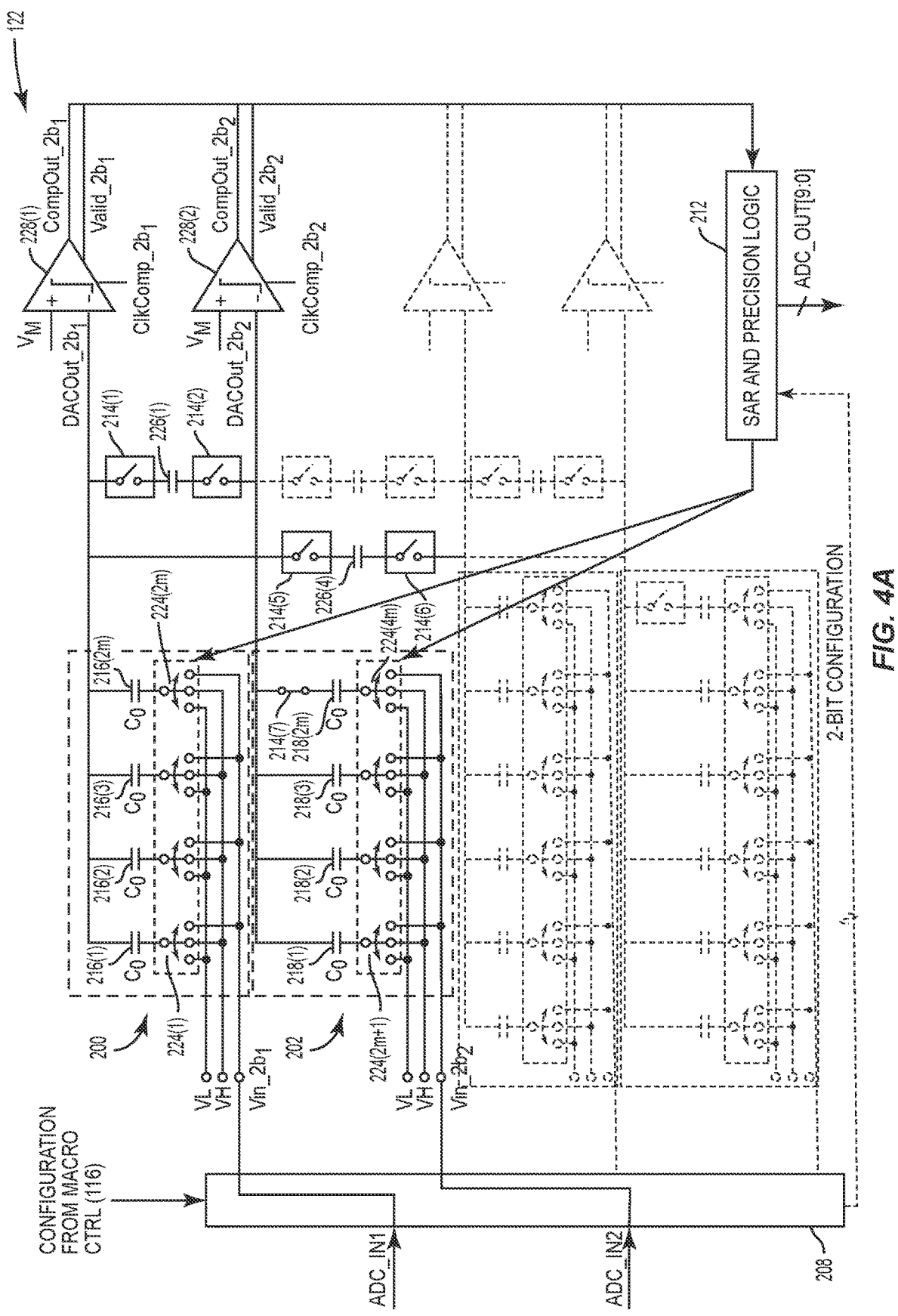
FIGS. 4A and 4B show exemplary configurations of the reconfigurable ADCs based on bit-precision requirements based on sparsity.
Figure 4B:
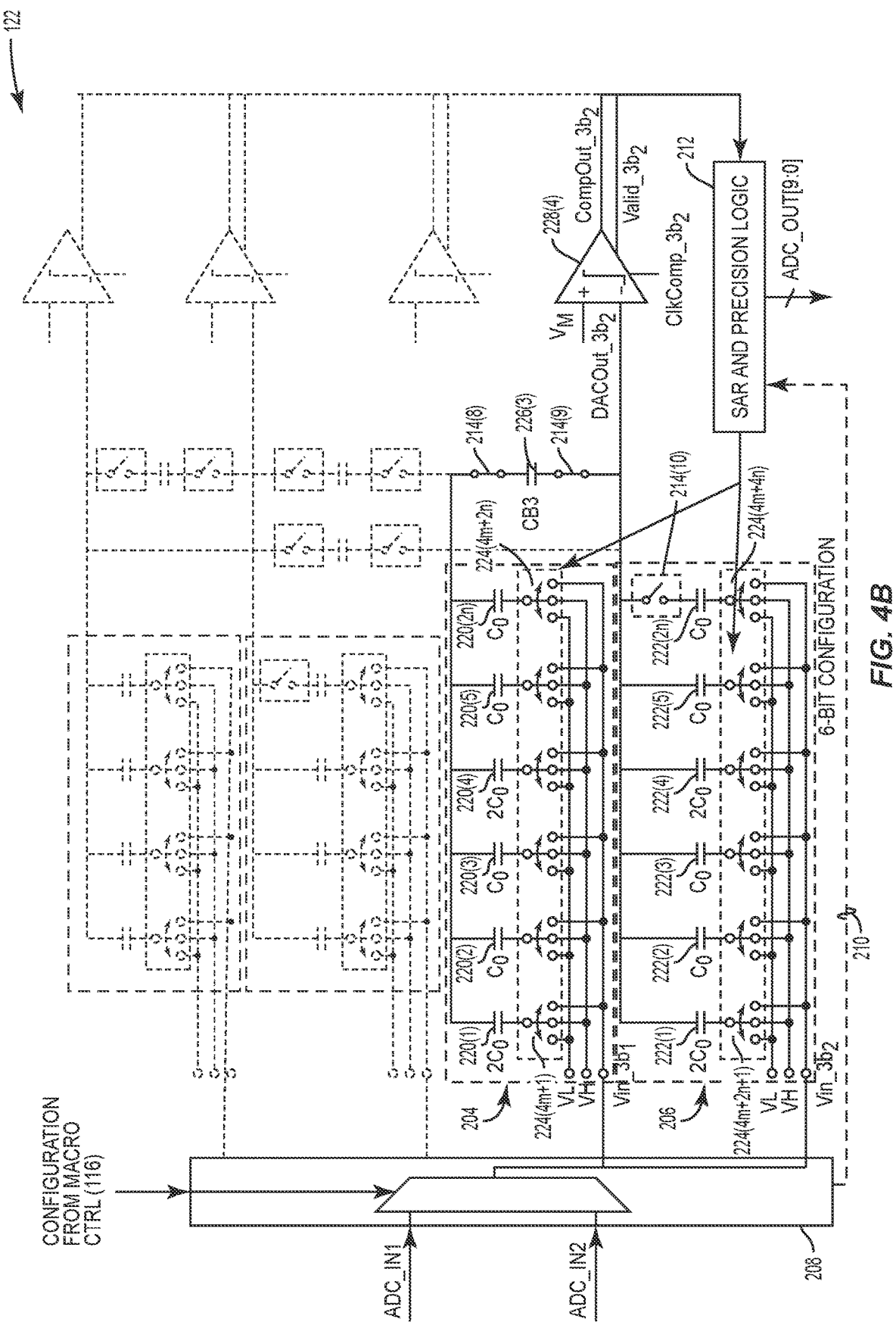

Exemplary switch configurations are illustrated in FIGS. 4A and 4B to show a two-bit configuration and a six-bit configuration, respectively. Specifically, in FIG. 4A, the switch 214(7) is closed (i.e., a short circuit) and the remaining switches 214(1)-214(6) and 214(8)-214(10) are open (i.e., open circuit) based on control signals from the SAR and precision logic circuit 212. This switch configuration prevents signals from the n-bit sub-ADCs 204, 206 from being generated or included as part of the summation by the SAR and precision logic circuit 212.

Similarly, FIG. 4B shows that that switches 214(8) and 214(9) are closed while switches 214(1)-214(7) and 214(10) are open. This routes the output of both n-bit sub-ADCs 204, 206 to the differential amplifier 228(4) for summation and use at the SAR and precision logic circuit 212. Still other switch configurations allow for 3-, 4-, and 5-bit precision. By selectively using the sub-ADCs in this manner, power is conserved while still providing desired bit precision.

Figure 5A:
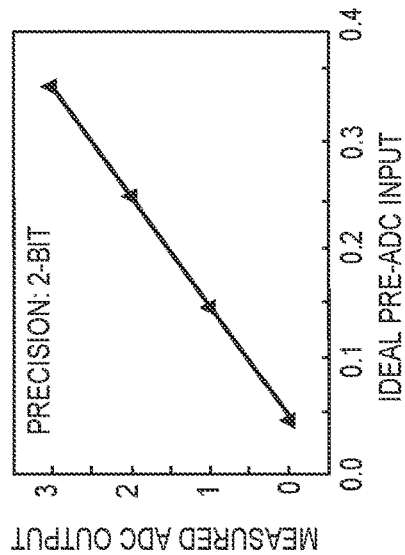
FIGS. 5A-5F illustrate performance of a device using the reconfigurable ADCs of the present disclosure through several graphs.
Figure 5B:
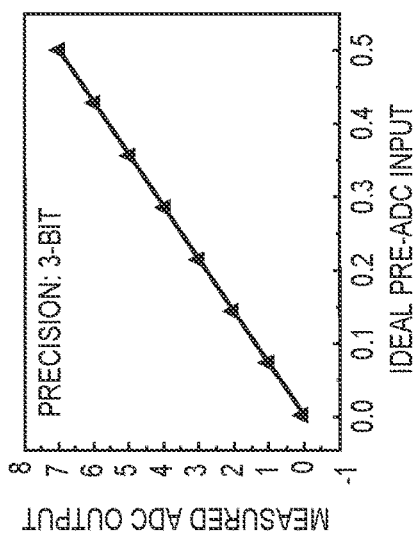
Figure 5C:
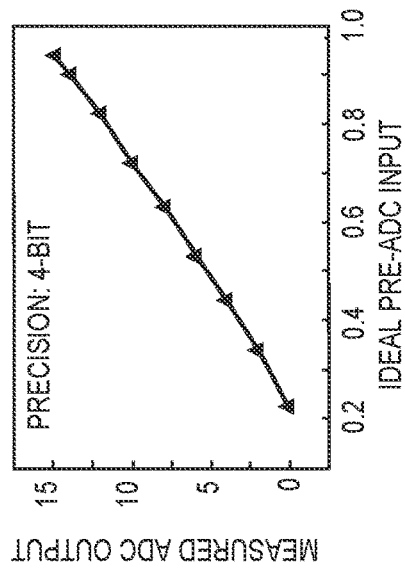
Figure 5D:
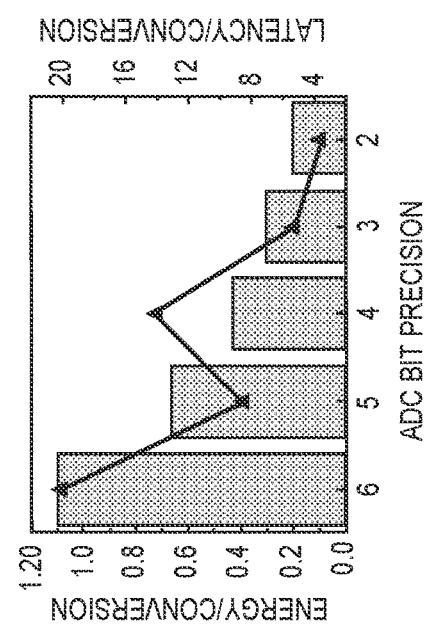
Figure 5E:
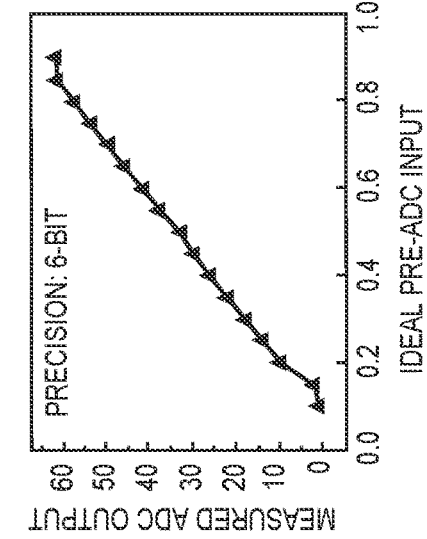
Figure 5F:
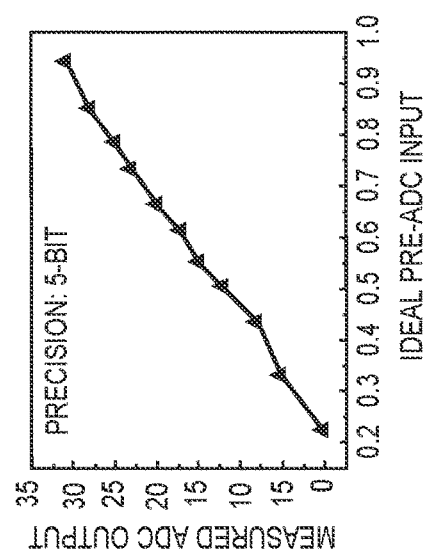

FIGS. 5A-5E provide some illustration as to the measured ADC output versus an ideal input for the various bit precisions. That is, FIG. 5A shows that for a 2-bit precision use, the output is nearly perfectly linear. Likewise, FIG. 5B shows that for a 3-bit precision use, the output is also nearly perfectly linear. FIGS. 5C-5E show 4-, 5-, and 6-bit precisions, respectively, with slight non-linearities, but overall linear performance. FIG. 5F shows energy conversion versus bit precision (the bar graphs) as well as latency versus bit precision (the line graph). As expected, as the bit precision approaches two, the energy consumed diminishes since fewer elements are active and consuming power. Likewise, as bit precision decreases, the latency decreases with the exception of four-bit because it involves the most intensive summation process.

The sparsity-aware reconfigurable CIM SRAM according to aspects disclosed herein may be provided in or integrated into any processor-based device. Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired, although as noted an 8T SRAM is well suited for use with the present disclosure. To illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A memory circuit comprising:
 a memory array comprising a plurality of memory cells;
 an analog-to-digital converter (ADC) comprising:
  a first m-bit sub-ADC; and
  a first n-bit sub-ADC, wherein n does not equal m; and
 a control circuit coupled to the memory array, the control circuit configured to:
  determine a workload sparsity level;
  based on the workload sparsity level, determine a bit-precision requirement; and
  based on the bit-precision requirement, activate the first m-bit sub-ADC, the first n-bit sub-ADC, or both.

2. The memory circuit of claim 1, further comprising a multiplexer coupled to an output of the memory array.

3. The memory circuit of claim 2, further comprising a transimpedance amplifier (TIA) coupling the multiplexer to the ADC.

4. The memory circuit of claim 3, further comprising a second multiplexer coupled to an output of the ADC.

5. The memory circuit of claim 1, wherein m is two (m=2) and n is three (n=3).

6. The memory circuit of claim 1, wherein the ADC further comprises a second m-bit sub-ADC and a second n-bit sub-ADC.

7. The memory circuit of claim 6, wherein the control circuit is further configured to, based on the bit-precision requirement, activate the second m-bit sub-ADC, the second n-bit sub-ADC, or both.

8. The memory circuit of claim 1, wherein the memory array comprises at least one eight-transistor (8T) static random access memory (SRAM) cell.

9. The memory circuit of claim 1, wherein the ADC comprises an input selector circuit.

10. The memory circuit of claim 9, wherein the ADC further comprises a plurality of switches configured to activate selectively the first m-bit sub-ADC and the first n-bit sub-ADC.

11. The memory circuit of claim 10, wherein the ADC further comprises at least 2*m plus 2*n capacitors.

12. The memory circuit of claim 1 integrated into an integrated circuit (IC).

13. A method comprising:
 in a memory cell, determining a workload sparsity level;
 based on the workload sparsity level, determining a bit-precision requirement; and
 based on the bit-precision requirement, activating a first m-bit sub-analog-to-digital converter (ADC), a first n-bit sub-ADC, or both.

14. The method of claim 13, further comprising passing the bit-precision requirement to a precision control circuit.

15. The method of claim 14, further comprising passing the bit-precision requirement to a precision logic circuit.

16. The method of claim 13, further comprising, based on the bit-precision requirement, activating a second m-bit sub-ADC, a second n-bit sub-ADC, or both.

17. The method of claim 13, wherein activating the first m-bit sub-ADC comprises opening at least one switch.

\* \* \* \* \*